(12) United States Patent  (10) Patent No.: US 7,989,984 B2
Draper et al.  (45) Date of Patent: Aug. 2, 2011

(54) UNDERWATER SUBSTATION

(76) Inventors: Mark R. Draper, Kenilworth (GB);
Timothy Liska, Lawreceville, NJ (US);
Stuart Bower, Rugby (GB); Robin Rhodes, Southam (GB)

( * ) Notice: Subject to any disclaimer, the term of this patent is extended or adjusted under 35 U.S.C. 154(b) by 27 days.

(21) Appl. No.: 12/231,744

(22) Filed: Sep. 5, 2008

(65) Prior Publication Data

US 2010/0084925 A1  Apr. 8, 2010

(51) Int. Cl.
*H02J 1/00* (2006.01)
*H02J 3/00* (2006.01)

(52) U.S. Cl. ............... 307/85; 290/42; 290/43; 290/44; 290/53; 290/54; 290/55

(58) Field of Classification Search ............ 307/85; 290/42, 43, 44, 53, 54, 55
See application file for complete search history.

(56) References Cited

U.S. PATENT DOCUMENTS

| | | | |
|---|---|---|---|
| 3,974,393 A * | 8/1976 | Marbukh et al. | 290/40 R |
| 4,335,319 A * | 6/1982 | Mettersheimer, Jr. | 290/54 |
| 5,440,176 A * | 8/1995 | Haining | 290/54 |
| 6,109,863 A * | 8/2000 | Milliken | 415/1 |
| 7,095,597 B1 * | 8/2006 | Cousineau | 361/20 |
| 7,821,150 B2 * | 10/2010 | Wolfe | 290/53 |
| 2002/0158472 A1 * | 10/2002 | Robson | 290/43 |
| 2005/0241558 A1 * | 11/2005 | Barlow | 114/200 |
| 2006/0232072 A1 * | 10/2006 | Manchester | 290/42 |
| 2008/0106101 A1 * | 5/2008 | North et al. | 290/53 |
| 2009/0212562 A1 * | 8/2009 | Jaugilas | 290/42 |

* cited by examiner

*Primary Examiner* — Rexford N Barnie
*Assistant Examiner* — Justen Fauth
(74) *Attorney, Agent, or Firm* — Henry I. Schanzer (57) ABSTRACT

An underwater substation pod (USP) adapted to collect and process the electrical outputs of an array of offshore power generating devices includes a voltage boosting transformer for combining and transmitting with increased efficiency an amplified version of the collected electrical outputs to an on shore facility. Combining the outputs and transmitting at a higher voltage reduces transmission losses and the number of cables required to transmit the electrical outputs. The USP is mounted on the seabed but operated at atmospheric pressure to accommodate standard components. The pod may be designed to include remotely controlled operation and to have a long service life since few, if any, moving parts are used. Also, the equipment may be designed to have a high degree of redundancy to provide greater reliability.

16 Claims, 8 Drawing Sheets

UNDERWATER SUBSTATION

BACKGROUND OF THE INVENTION

This invention relates to an offshore underwater substation designed to harvest the energy/power outputs generated by a multiplicity of different offshore energy/power producing devices and to combine the energy/power outputs and process them so as to increase the efficient transmission of the energy/power from the substation to a point or facility on shore.

Due to an increase in the demand for alternate sources of energy, there has been a steady increase in offshore power generation. The offshore sources of power generation may vary from those responsive to offshore wind and/or to forces of the ocean waves and/or to tidal forces. In the discussion to follow, reference will be made to the generation and harvesting of electric power. However, the teachings herein may be applicable to any form of energy generation.

An array ("farm") of different energy/power generators may be disposed in an offshore location. Transmitting the output of each power generator individually is inefficient in terms of processing (and/or converting) each output and in the cost of transmitting and delivering each output. There is a need for infrastructure to collect the energy/power generated offshore by the various offshore generation sources and to transmit the energy/power to a central facility, or grid, located on shore. For example, it is desirable to collect and convert the output of many power generators of electric power and to transform (boost) voltage outputs to a high amplitude voltage for transmission in order to reduce the electrical cable cost and power losses. It is also desirable to arrange for the various energy outputs (e.g., the voltage outputs) to be processed through common processing equipment (e.g. one main cable) to an onshore grid.

Consideration was given to an ocean surface mounted substation. However, interconnecting the outputs of the various offshore power generating sources presents problems peculiar to that environment. In particular, there is a need to protect all connections and components from the marine environment and the pitching and movement associated with anything on the sea surface. Applicants' invention resides in part in the recognition that an undersea substation, as compared to a surface mounted substation, provides protection from the elements and movement at the surface and greater security. However, provision has to be made for connecting and disconnecting of various power producing devices under various conditions and for the efficient power transmission to shore. Therefore, Applicants also recognized that a substation embodying the invention has to be robust to be able to survive the harsh environmental conditions, whilst also requiring minimum attention for operation (which is preferably done remotely) or maintenance.

SUMMARY OF THE INVENTION

Applicants' invention is directed to a novel system for an Underwater Substation Pod (USP) to allow extension of conventional grid infrastructure into offshore applications for use in developing offshore wind, wave and tidal applications. The novel system includes construction, deployment and retrieval methodologies as well as apparatus and systems for reducing maintenance requirements to ensure a long term cost-effective solution.

In accordance with one aspect of the invention, an array of offshore power generating devices may be positioned in an offshore location. For purpose of illustration, the power generating devices will be considered to be wave energy converters (WECs) generating electrical outputs. It is desirable to collect the outputs of the array of WECs together, offshore, at a location relatively convenient to all the WECs. In accordance with the one aspect of the invention, an undersea substation pod (USP) is provided to receive the electrically generated outputs of the different WECs and for processing and standardizing the outputs which may then be combined. Where appropriate, the combined outputs may be converted (and transformed) to produce a higher voltage for transmission to shore. Combining the outputs and transmitting the resultant after transformation to a higher voltage minimizes the transmission losses and reduces the number of cables required to transmit the voltages. In accordance with the invention, the USP is mounted on the seabed, is designed to include remotely controlled operation and to have a long service life since few, if any, moving parts are used. Also, the equipment may be designed to have a high degree of redundancy to provide greater reliability. The fabrication of a substation and the methodology for deployment and retrieval of the USP is also included, as well as a full control system.

BRIEF DESCRIPTION OF THE DRAWINGS

In the accompanying drawings like reference characters denote like components.

DETAILED DESCRIPTION OF THE INVENTION

Figure 1A:
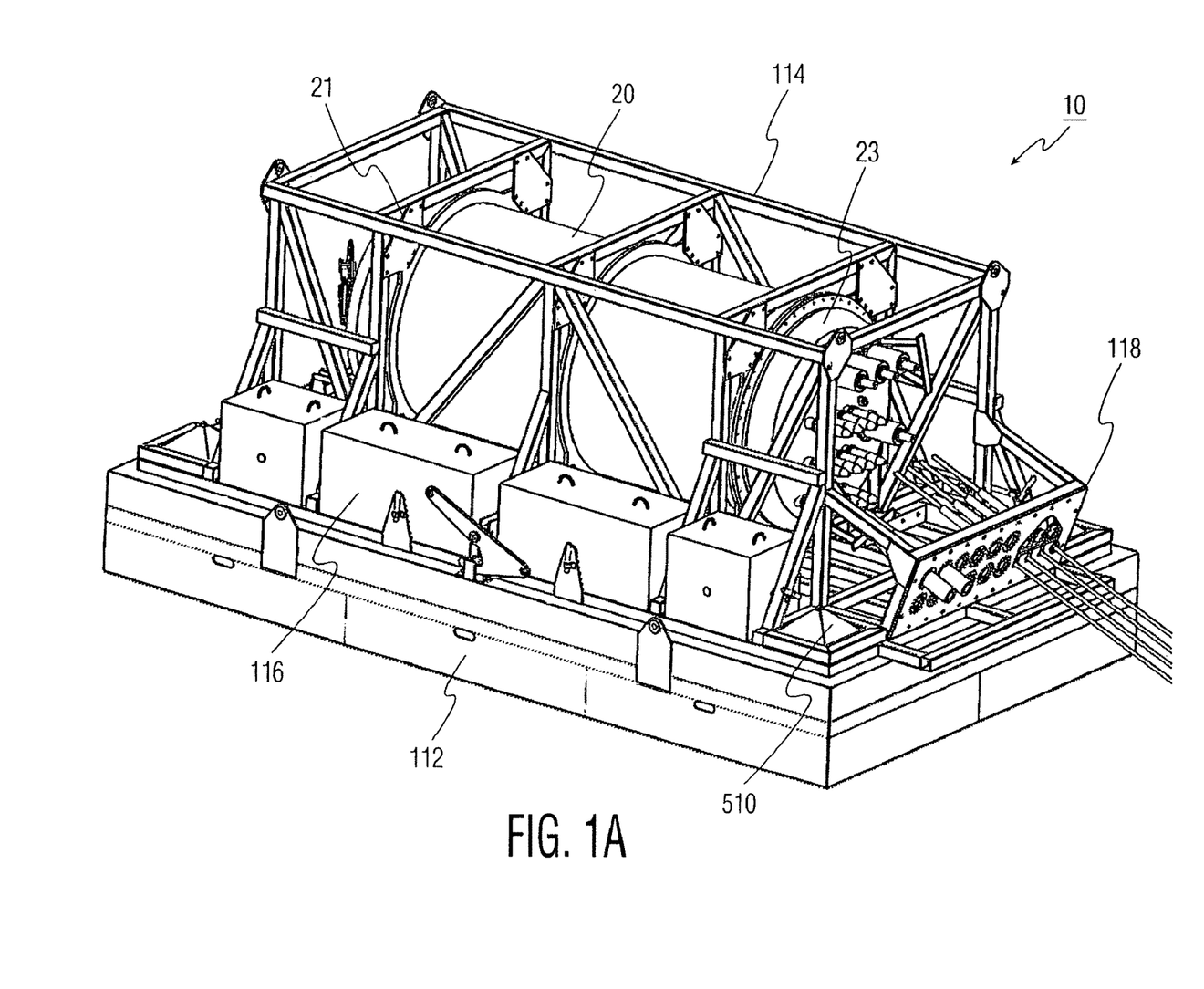
FIG. 1A is an isometric drawing of an undersea substation ("USP") embodying the invention with a concrete base for securing the USP to the seabed.

An undersea substation pod (USP), 10, embodying the invention is shown in FIG. 1A. The USP, as noted above, is designed to harvest the energy/power outputs generated by a multiplicity of different offshore energy/power producing devices and to combine the energy/power outputs and process them so as to increase the efficient transmission of the energy/power from the substation to a point or facility on shore. The USP 10, also referred to herein as a pod, is designed to be mounted on the sea bed (under water). The pod's mechanical structure includes a concrete base 112, an outer frame 114, fitted with concrete ballast blocks 116, and a cylindrical vessel 20, which contains the substation's electrical equipment, nested within the outer frame 114. The USP 10 is held down by gravity due to its natural weight plus that of the concrete ballast blocks 116 applied on each side of the frame, and the concrete base to which it is attached.

Figure 1B:
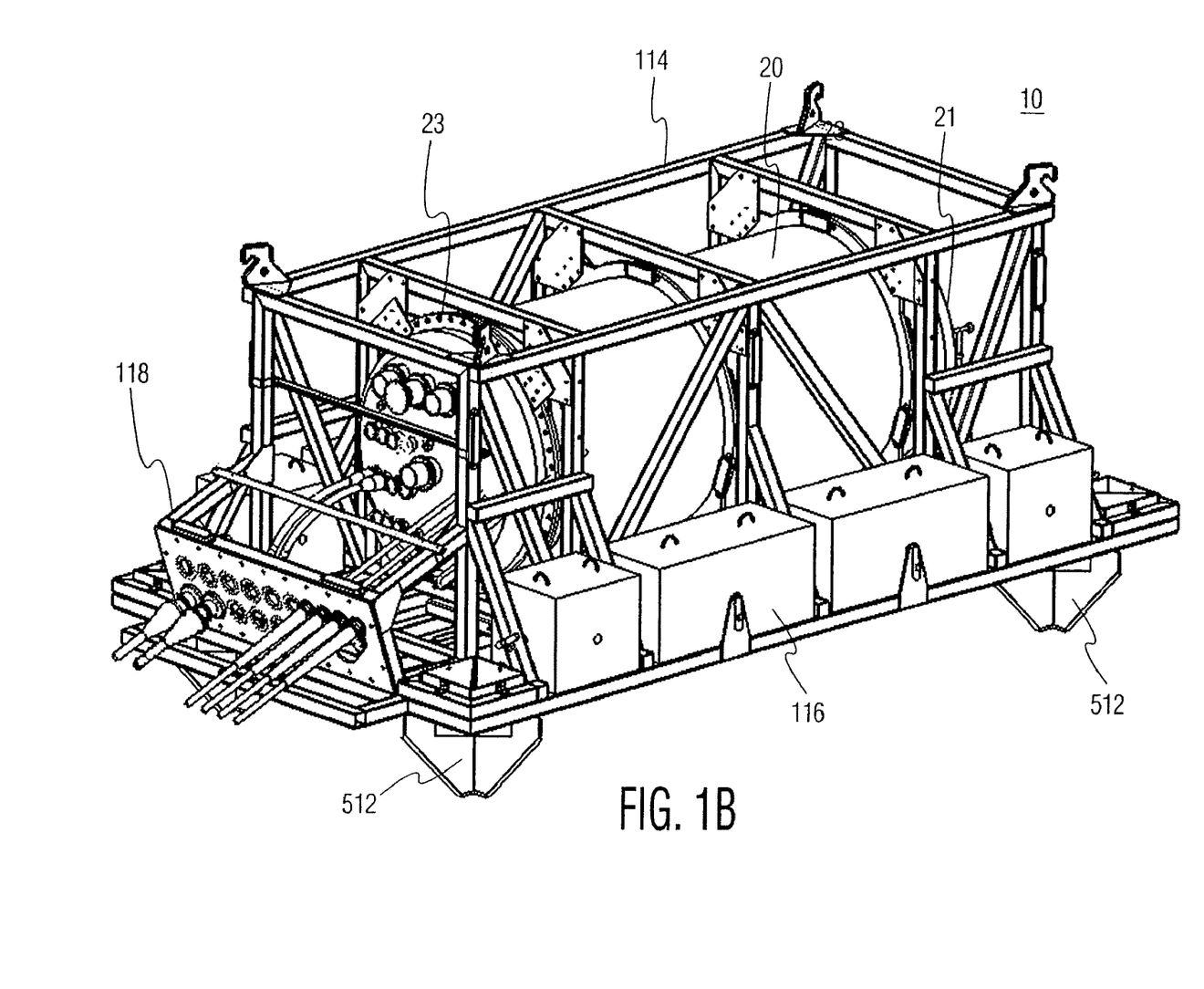
FIG. 1B is an isometric drawing of a USP embodying the invention with embedment daggers for securing the USP to the seabed.
Figure 5A:
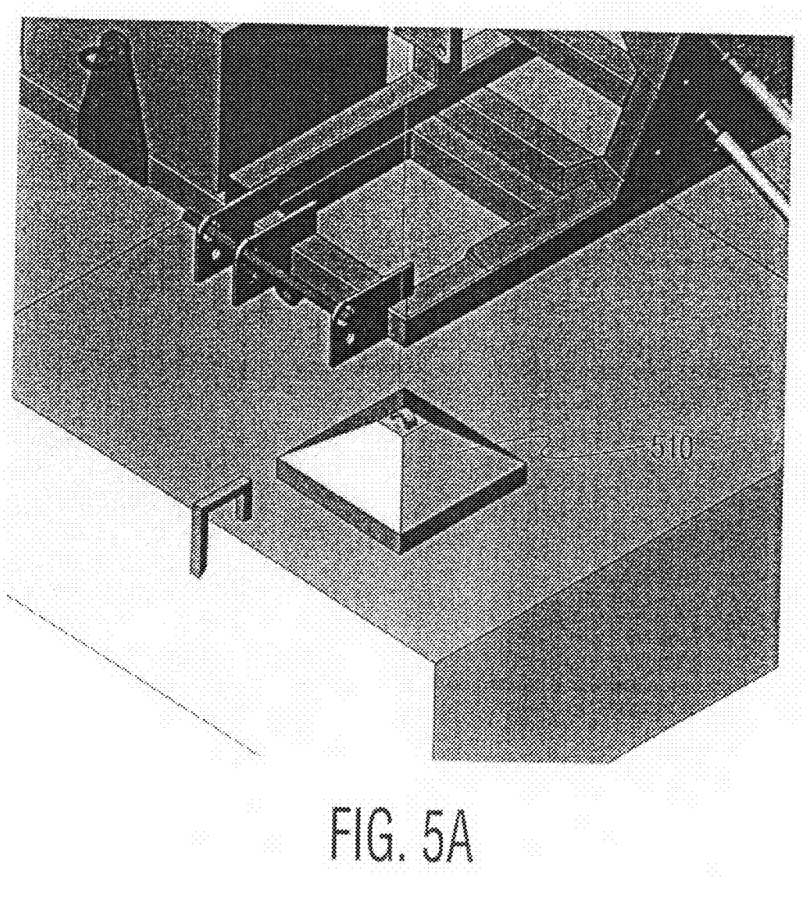
FIG. 5A is an isometric drawing of a location pin for use in locating and placing parts of a USP using a concrete base option.
Figure 5B:
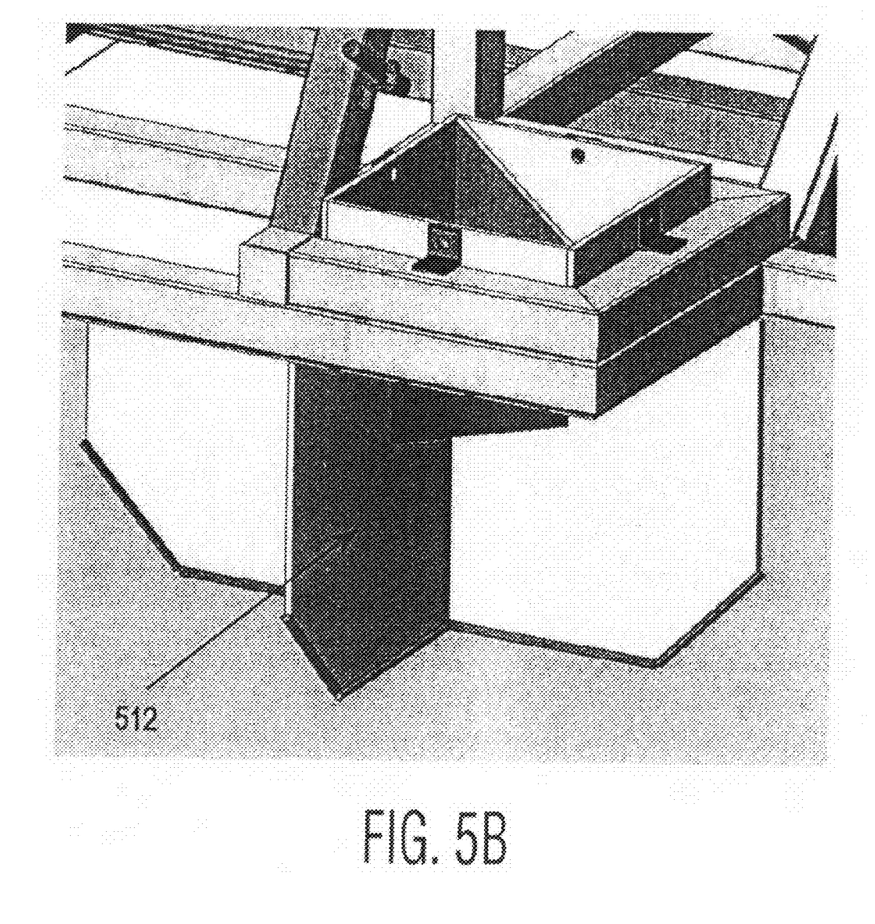
FIG. 5B is an isometric drawing of an embedment dagger for securing a USP to the seabed.

Alternatively, the concrete base 112 can be replaced with embedment daggers 512, as shown in FIG. 1B and further detailed in FIG. 5B, to secure the pod to the seabed. The daggers are designed to penetrate into the seabed under the weight of the USP to a depth of, for example, 1 meter and thus give horizontal holding force to resist any movement induced by tidal or wave motion. In the event of an accidental snagging of any cable by a ship anchor or other, these daggers will hold the USP in place with a strength beyond that of the low voltage (LV) cable breaking force, ensuring a snag will not lead to the USP moving. The daggers are detachable so are only fitted to the underside of the frame prior to actual deployment into the sea. The daggers 512 may be made of mild steel plate of a thickness to match the imposed force and painted for corrosion protection.

As shown in FIGS. 1A, 1B, 3 and 4, a cable termination plate 118 which is attached to the frame 114 extends in front of bulkhead 23. Each cable between a WEC and the pod 10 can has its outer armouring (sheath) terminated on plate 118 by means of a termination fixture, and then the inner conductors and fiber optics may then continue to a "penetrator" mounted on the bulkhead 23; each penetrator (Pi) providing a water tight connection from the exterior of the vessel to the internal chamber 22.

Figure 2:
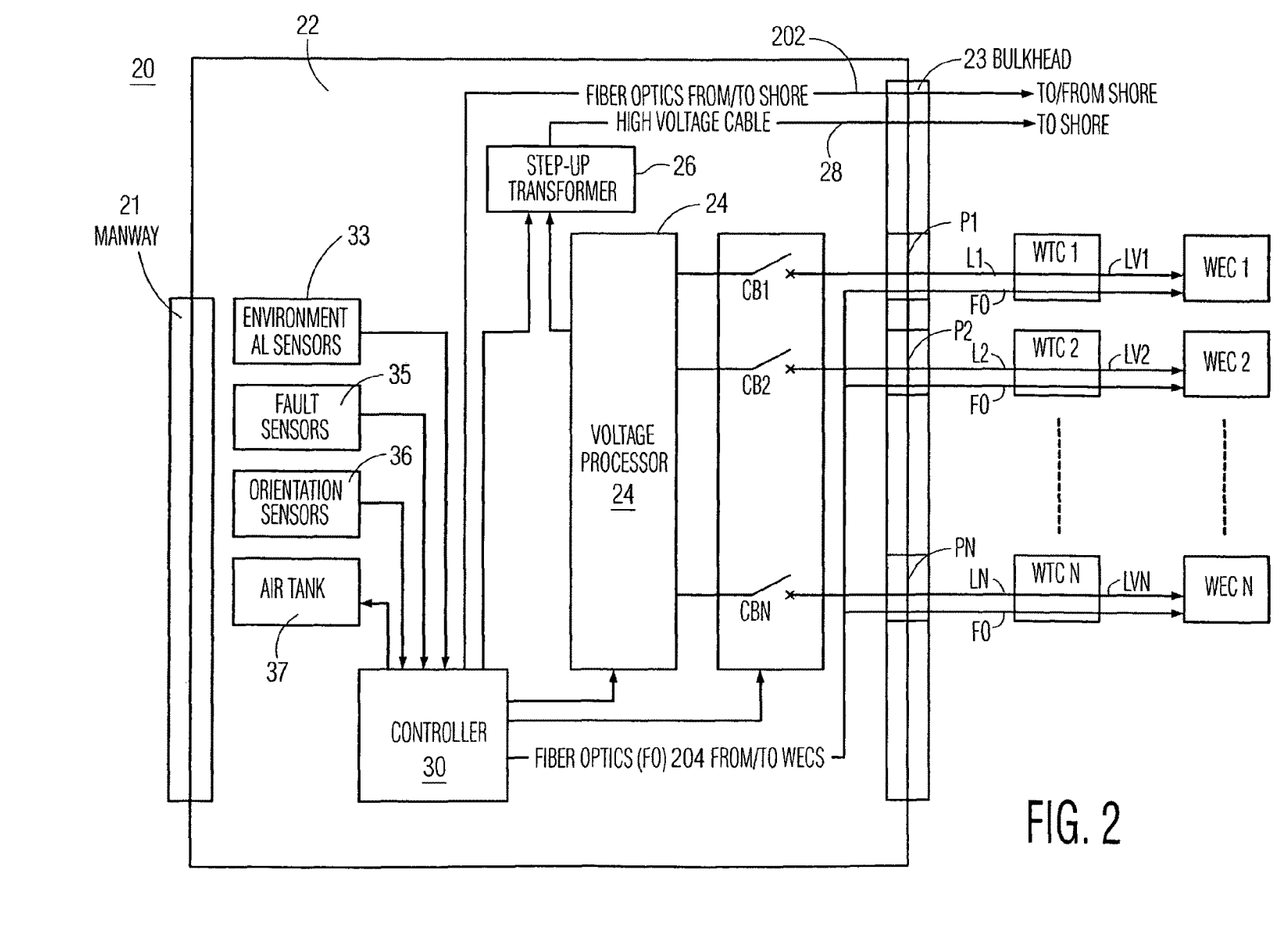
FIG. 2 is a simplified block diagram illustrating the coupling of an array of WEC outputs to the input of a step-up transformer in a substation in accordance with the invention.

The cylindrical vessel 20 has an outer wall and includes an inner chamber 22 within which is contained the equipment shown in FIG. 2. As shown in FIG. 2 there is a man-access hatch 21 at one end of the vessel 20, and a full diameter bolted flange 23 (as also shown in FIGS. 1A and B) at the other end of the vessel to allow full human and/or robotic access to the electrical components during construction of the substation and for its maintenance when the USP 10 is out of the water. The man-access hatch 21 allows easier access for minor inspections—but only when the USP is out of the water. The man-access hatch 21 and the full diameter flange 23 are made with double O-rings and designed to withstand an external pressure commensurate with design depth of the USP. The pressure inside the USP 10 is kept at atmospheric pressure to enable the use of standard electrical components. Dry air or nitrogen may be used to fill the inner chamber of the vessel. The pressure inside the vessel 20 may be established and maintained at normal atmospheric pressure to enable use of standard components. This is done in recognition of the problem that, at certain pressures, standard components may not operate as intended. Operating the chamber at a pressure other than atmospheric pressure would require the use of specially designed components which would greatly increase the cost and reduce the availability of the equipment placed inside chamber 22. These problems are solved by keeping the chamber at normal atmospheric pressure. But, this requires that the chamber be airtight. Hence, there may be a need to monitor the pressure inside the chamber to determine if a leak develops and what preventive and/or corrective action to take.

Referring to FIG. 2 there is shown an array ("farm") of wave energy converters (WEC1 through WECN). The electric/power outputs of the WECs are coupled via corresponding respective cables (LV1 through LVN) to respective water tight couplers (WTC1 through WTCN) which are then coupled via corresponding respective cables (L1 through LN) to respective water tight connectors ("penetrators"), P1 through PN, mounted on bulkead 23. Note that there is a two stage interconnection. That is, each WEC (e.g., WEC1) is coupled to a corresponding water tight connector (e.g., WTC1) via a first flexible line (e.g., LV1) which has substantial play to allow for connection and disconnection for the connector. This facilitates the making of electrical connection to the WEC at the water surface, thus removing the need for connectors that are mateable underwater and the installation vehicles and equipment required to make those connections. Then, there is a cable (e.g., L1) connecting each WTC (e.g., WTC1) to the corresponding penetrator (e.g., P1) located on the bulkhead. Each penetrator then provides a water tight connection from the exterior of the vessel 20 to the interior of the chamber 22. The penetrators, which extend from outside vessel 20 to within the chamber 22 of vessel 20, are in turn connected, within the chamber, to respective circuit breakers (CB1 through CBN). Thus, within the USP 10 there is a bank of circuit breakers, with each circuit breaker being fed at its input (one) side by a separate "relatively" low voltage cable carrying power from a corresponding WEC.

The output (other) sides of the circuit breakers are then connected to a voltage processor 24 which is used to combine the voltages at the output sides of the circuit breakers, either directly or after further processing, for application to the input of a step-up (boost) transformer 26.

In a particular embodiment, the WECs all produce grid or utility quality synchronous AC power and the combination of the WEC outputs is achieved by simply synchronising them and connecting them via the circuit breakers and conductors to the input of transformer 26; as is typically done with such type of generating systems. The stepped-up (high voltage) output of transformer 26 is fed directly to an undersea high voltage (HV) cable 28 (which may carry 3 phase power).

In FIG. 2, a circuit breaker is not used on the higher voltage side, to reduce the number of components and thus enhance reliability. However, a circuit breaker may be added, if it is desired to break transmission at the substation output end. Transformer 26 may be designed to raise the voltage applied to its input by any factor which will render the transformer's voltage output suitable for coupling to an on shore grid and/or any selected output point. Raising the voltage of the power being transmitted is done to reduce the power losses in the lines. By way of example, the amplitude of the outputs from the WECs may be in the range of a few hundred volts while the amplitude of the output from transformer 26 may be 10, 20 or even more than 100 times greater. In general, transformer 26 may be any device capable of boosting the voltage to a desired level.

The circuit breakers (C1 through CBN) may be of the mechanical type or solid state devices requiring no moving parts. The circuit breakers are located between the WECs and the relatively lower voltage conductors and may be designed to be fully operable by remote control. As shown in FIG. 2, the circuit breakers may be controlled by a controller 30 to which is applied a variety of control signals including control signals from a shore controller and/or the WECs. The control signals may be coupled to the controller 30 via optic fibres (e.g., 202, 204) which may be run along the high and low voltage power cables (HV and LV1-LVN). The circuit breakers are designed to be used for operation when a fault condition occurs or when there is a need for maintenance or in response to a predetermined system condition; (e.g. disconnection of a feed, or when there is a cable fault on one side of the feeds). Normal electrical synchronising operations for combining the WEC outputs to the lower voltage conductors will be carried out by circuit breakers inside the WECs. Synchronisation of the substation output to the onshore grid may be carried out by an onshore circuit breaker, which would normally remain closed once the USP is installed and commissioned.

Electrical Cable Connections

The electrical cables (which may be suitable to carry 3-phase power) are all marshalled in through sealed water tight cable connecting points ("penetrators") mounted on the fixed domed end 23 of the USP, and extending from the outside to the inside of the vessel 20. As part of the design, cable connection fixtures are welded into the domed end during fabrication. These are designed to the correct dimension to accept cable terminations which are factory fitted to the end of each cable. The termination is then mounted into each cable connection fixture and sealed. These terminations are all pressure tested, on manufacture, to depth design pressure. Each lower voltage cable (LV1-LVN and corresponding cable L1-LN)) goes to and through a separate cable connection fixture (all phases of the lower voltage cable may enter via one penetration or there may be one per phase). The higher voltage cable (HV) also has a cable connection fixture in the embodiment shown in FIG. 3, each phase (28a, 28b, 28c) of the higher voltage cable may enter/exit separately. All cables have a means of mechanical termination and strain relief prior to entering the cable connection fixtures.

Build Up

The frame 114 is manufactured first with the fixed dome end attached. An electrical skid is built up, tested, and then the complete skid is inserted within the frame, allowing all the cable connections to be made. This will include appropriate lengths of cable on the outside to get to shore or make in line connections as required. Once the electrical connections have been internally tested, the remaining 'cigar tube' (cylindrical) section of the pressure vessel 20 is slid on using supporting rails provided. Once fully in place the flange joint connecting/sealing the domed end 23 to the vessel 20 is bolted up and sealed by double O-rings contained within the joint, and other mechanical connections are made (see FIG. 4).

Deployment

As shown in FIG. 1A, The USP 10, when deployed, sits on a large concrete base 112, made up of, for example, six sections, which are bolted together prior to deployment. This base is laid onto a surveyed area of seabed conveniently located with respect to the offshore array or farm of WECs which it is to service. The USP 10 is lowered down onto the base using guide lines onto location 'pyramids' 510 formed on the concrete base (see FIG. 1A and FIG. 5A). For subsequent retrieval the substation is simply lifted away from the concrete base and then subsequently relocated; the concrete base is generally left in place.

Alternatively, the USP can be equipped with embedment daggers 512 on its base to enable direct placement on to the seabed without the use of a separate concrete base (see FIG. 1B and FIG. 5B).

Once the USP 10 is in place on the seabed the cable connections will be made as required. In each case previously terminated lengths of cable, long enough to lift to the surface, allow a splice or connection to be made to connect to the WECs, or other generating device. Thereafter, the connection is lowered back to return to the seabed. The higher voltage cable will be connected to the USP at the surface just prior to deployment by the use of a cable connection fixture.

Control and Communication

The control system/electronics of USP 10 is connected to shore via optic fibers (202 in FIG. 2) or other communications means which may be included within the higher voltage cable, or run separately and independently thereof. The optic fiber network allows for full remote control and monitoring of all aspects of operation. Each of the lower voltage cables may also carry optic fibers (204 in FIG. 2) or other communications means which may be included within the lower voltage cable, or run separately and independently thereof. Connection between the fiber optics and controller 30 also allows for full remote control and monitoring of the WECs (buoys) or other power generating devices.

As noted above, the circuit breakers may be operated in the event of any fault on the lower voltage cables. In FIG. 2, in the event of a fault in the higher voltage cable or in the transformer, protection circuitry may exist at the shore point to disconnect the entire cable and USP. Alternatively, protection circuitry may be provided at the substation.

Full remote monitoring and control of all aspects of the USP is provided by the control system. These aspects include but are not limited to control and monitoring of the fault protection devices (e.g. circuit breakers, protection relays, etc.), environmental monitoring devices (e.g. temperatures, humidity, leak detection, etc.) and USP orientation (e.g. tilt monitors).

All fault protection devices can be remotely operated and monitored to ensure that appropriate actions are taken upon fault conditions and individual WECs (buoys) can be isolated if required for maintenance.

Many different sensors (e.g., environmental sensors 33, fault sensors 35 and orientation sensors 36 in FIG. 2) may be provided to monitor a number of different environmental and fault conditions in the USP 10 and to provide early warnings of conditions that could affect the operation of the USP (e.g. leaks and the rate of leakage). Preventative maintenance can be scheduled to minimize unscheduled down time. Sensors 33, 35 and/or 36 may include an orientation sensor to ensure that the USP is placed properly on the ocean bottom and to monitor positional changes that may affect USP or buoy farm operation.

Figure 2A:
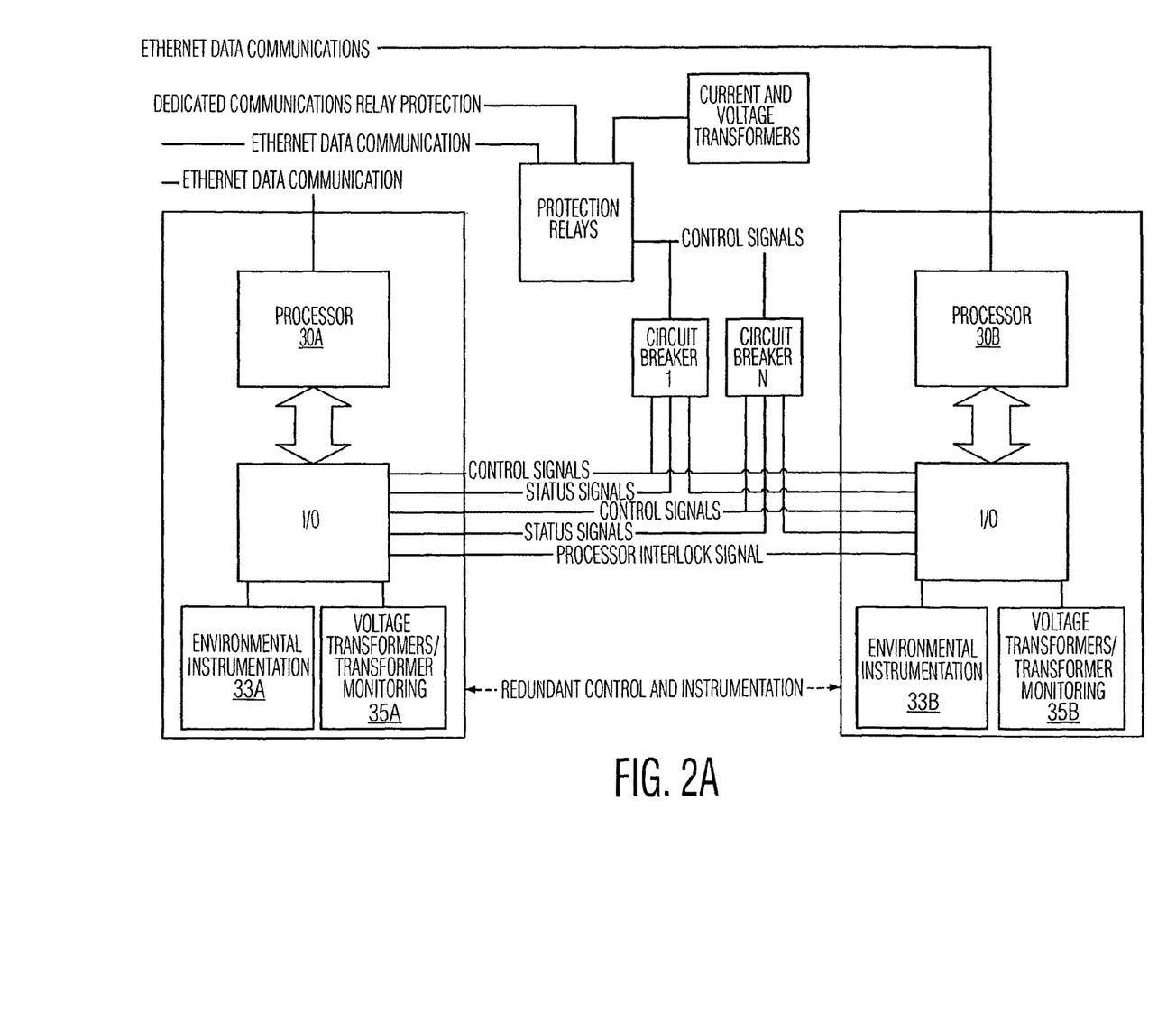
FIG. 2A is a simplified block diagram illustrating redundant control and instrumentation for use in a USP embodying the invention.
Figure 3:
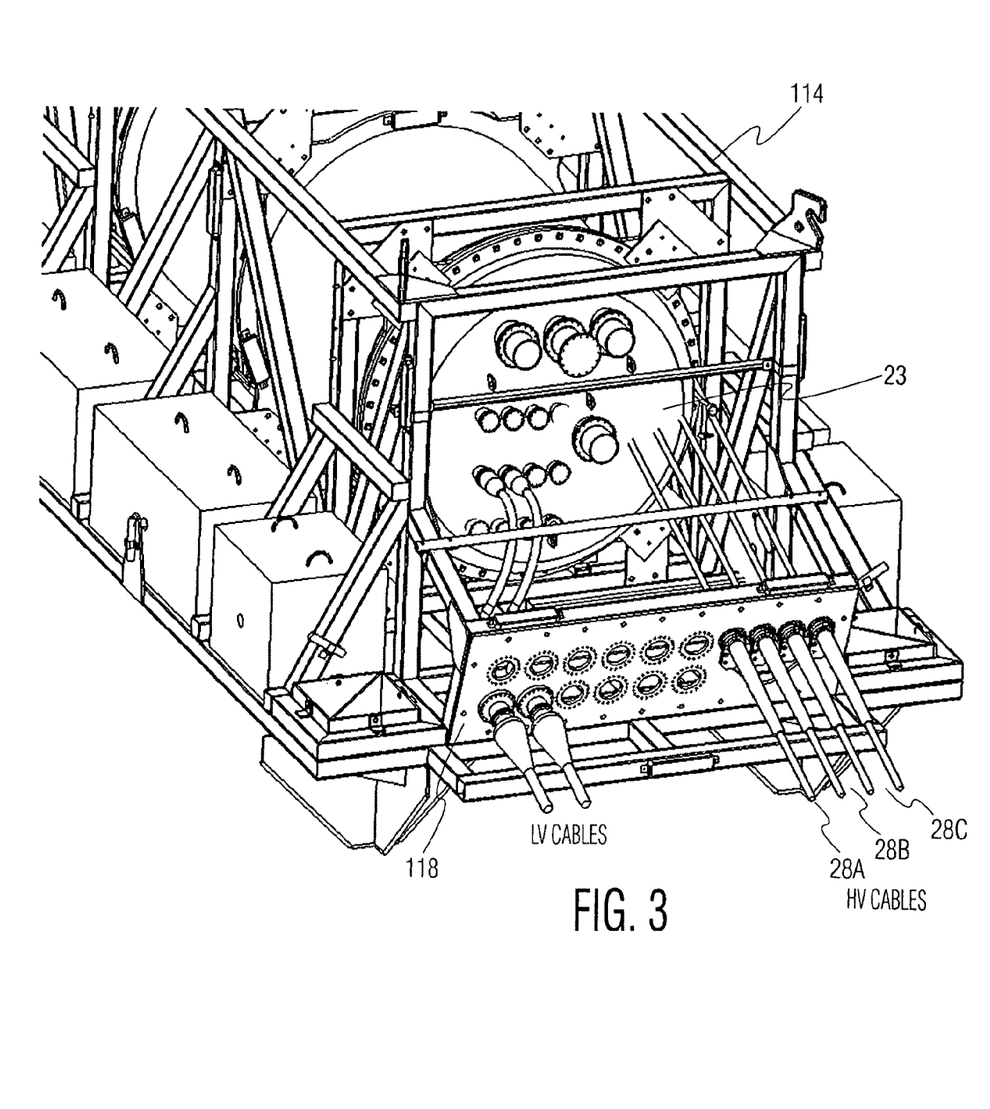
FIG. 3 is an isometric drawing showing cable termination and entry into a USP.
Figure 4:
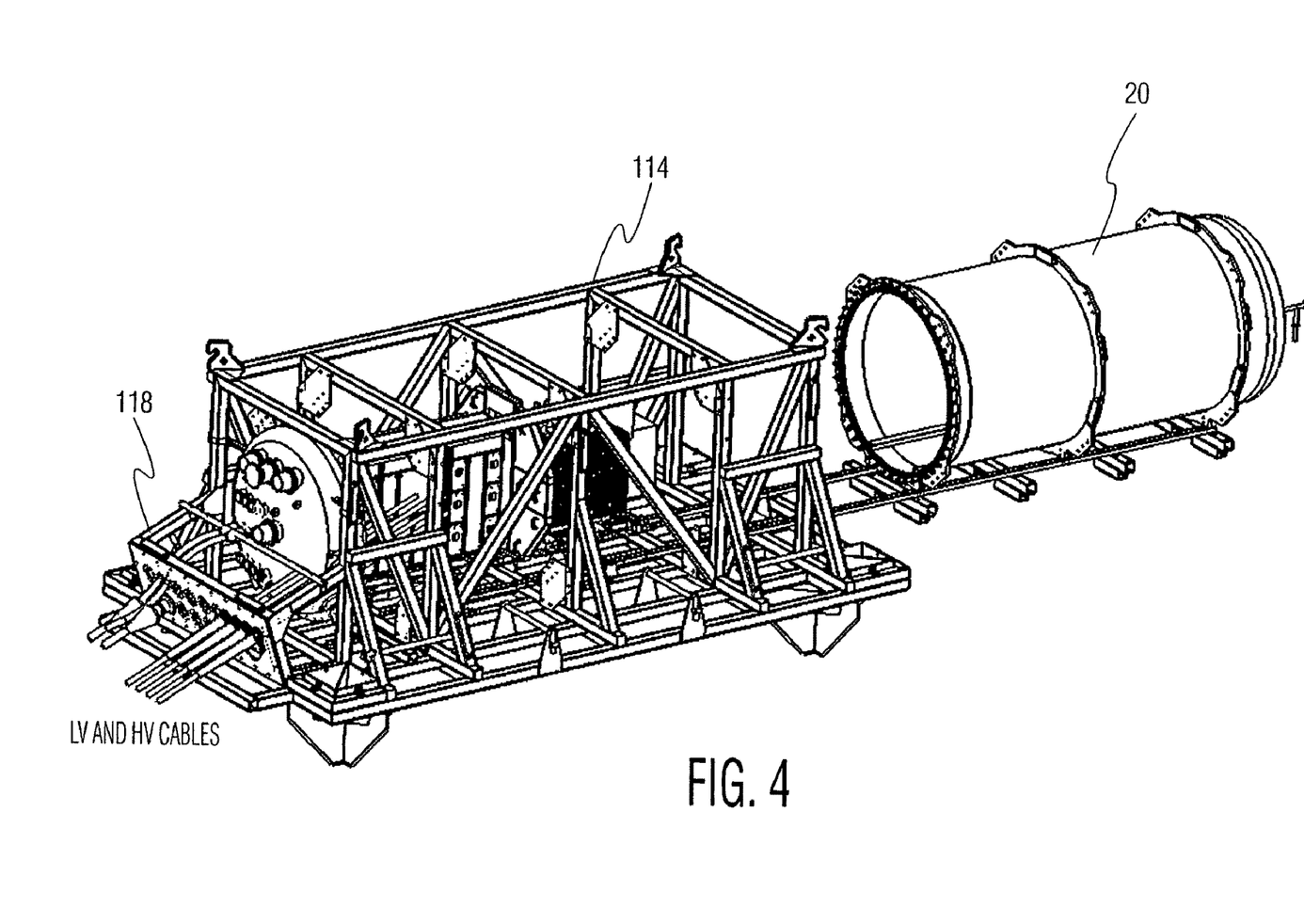
FIG. 4 is an isometric drawing illustrating a stage of the construction of a USP.

Redundant control systems and sensors (as shown in FIG. 2A) may be included to provide greater reliability for the undersea substation. Redundant processors (30a, 30b), sensors (35a, 35b, 33a, 33b) as well as redundant power supplies and a split LV bus scheme (or other isolation means, not shown) may be provided to ensure that if a fault were to occur in one of the control systems or power supplies the other control system and the majority of USP control functions would remain operational and half the WECs (buoy farm) would remain on line.

The control system and protection scheme is designed to allow a "black start" i.e. the capability to start the USP without batteries or an auxiliary power source within the USP.

Cooling

The step-up transformer 26 is designed to be cooled passively via a combination of radiation, convectors, and direct conduction to the inner wall of the USP. The heat is then conducted though the wall of vessel 20 and into the surrounding sea water. The design ensures that the temperature within the USP will remain at a level consistent with long life of the control components. These are further protected by thermally isolating the transformer with a 'thermal wall' to limit the transfer of heat from the transformer to the more sensitive electronic components within the other end of the USP.

What is claimed is:

1. An underwater substation for receiving and processing the electric power generated by an array of separate and independent electric power generating devices located offshore and externally to the substation comprising:

a vessel having an exterior surface and an internal chamber;

means coupled to the exterior surface of the vessel for selectively placing and maintaining the underwater substation on the seabed of a body of water;

means for coupling the electric power generated by the power generating devices located externally to the substation to sealed water tight electrical connections located along the exterior surface of said vessel and extending from the exterior surface of the vessel to within said internal chamber; and power processing means within said internal chamber for combining and processing the electric power generated by the array of power generating devices and for producing an output suitable for transmission to an onshore facility with greater efficiency.

2. An underwater substation as claimed in claim 1
wherein said power generated by said array of power generating devices includes voltage generation; and
wherein said power processing means includes a voltage boosting means having an input port and an output port, said voltage boosting means for raising the amplitude of the voltage applied at the input port for transmission via a high voltage cable to shore;
means including controllable connect/disconnect means coupled between the sealed water tight connections and the input of the voltage boosting means for coupling and decoupling the outputs of the power generation devices from the water tight connections to the input port of the voltage boosting means; and
control means coupled to the controllable connect/disconnect means for selectively remotely controlling the outputs of the power generating devices applied to the input port of the voltage boosting means.

3. An underwater substation as claimed in claim 2, wherein the voltage boosting means is a transformer; and wherein the means including controllable connect/disconnect means coupled between the sealed water tight connections and the input of the voltage boosting means includes a voltage processor having an input port coupled to the output points of the connect/disconnect means and having an output port coupled to the input of the voltage boosting means.

4. An underwater substation as claimed in claim 2, including means for maintaining the pressure within the internal chamber at atmospheric pressure to enable the use of standard components in the chamber.

5. An underwater substation as claimed in claim 3, wherein the voltage boosting transformer is cooled by thermally coupling the transformer to the exterior surface of the vessel in contact with the surrounding body of water.

6. An underwater substation as claimed in claim 2, wherein the array of power generating devices are wave energy converters (WECs).

7. An underwater substation as claimed in claim 2, wherein the connect/disconnect means are circuit breakers composed of solid state devices.

8. An underwater substation as claimed in claim 2, wherein the substation is formed using modular components.

9. An underwater substation as claimed in claim 2, wherein the means for coupling the power generated by the array of power generating devices to sealed water tight connections extending from the exterior surface of the vessel to within said internal chamber includes cables with strain relief and water tight connections.

10. An underwater substation as claimed in claim 2, wherein there is also included a voltage processor, a controller and fiber optics means for selectively supplying signals to the controller, the voltage processor and the voltage boosting means.

11. An underwater substation as claimed in claim 10 further including a plurality of sensors for sensing selected fault and environmental conditions and for application to the controller for processing.

12. An underwater substation as claimed in claim 1 wherein said means coupled to the exterior surface of the vessel for selectively placing and maintaining the underwater substation on the seabed of a body of water includes a location pin.

13. An underwater substation as claimed in claim 1 wherein said means coupled to the exterior surface of the vessel for selectively placing and maintaining the underwater substation on the seabed of a body of water includes an embedment dagger.

14. An underwater substation for receiving and processing the electric power generated by an array of separate and independent electric power generating devices located offshore and which are located externally to the substation comprising:
a vessel having an exterior surface and an internal chamber, said vessel adapted to be secured to the seabed of a body of water;
a multiplicity of sealed water tight power connectors extending from the exterior surface of the vessel to within said internal chamber;
electrical power conducting means for coupling the electric power generated by the array of separate and independent power generating devices to said sealed water tight connectors extending from the exterior surface of the vessel to within said internal chamber; and
power processing means within said internal chamber including switching means coupled between the sealed water tight connectors and a voltage boosting means for suitably combining and processing the electrical power generated by the array of power generating devices and for producing an output suitable for transmission to an onshore facility with greater efficiency.

15. An underwater substation for receiving and processing the electric power generated by an array of separate and independently operated electric power generating devices located offshore and at a distance from said substation comprising:
a vessel having an exterior surface and an internal chamber, said vessel adapted to be secured to the seabed of a body of water;
a first set of cables for coupling the electric power generated by the array of separate and independently operated power generating devices to a first set of sealed water tight connectors and a second set of cables, corresponding to said first set, connected between the first set of water tight connectors and a second set of water tight electrical connectors, termed penetrators, extending from the exterior surface of the vessel to within said internal chamber; and
power processing means within said internal chamber including controllable connect/disconnect means coupled between the sealed water tight connections and a voltage boosting means for combining and processing the electrical power generated by the array of power generating devices and for producing an output suitable for transmission to an onshore facility with greater efficiency.

16. An underwater substation as claimed in claim 15 wherein said first set of sealed water tight connectors may be raised to the surface of the body of water to facilitate the connection and disconnection of the power generating devices.

* * * * *